(12) United States Patent
Lee

(10) Patent No.: US 7,812,359 B2
(45) Date of Patent: Oct. 12, 2010

(54) ORGANIC ELECTROLUMINESCENT DEVICE

(75) Inventor: Chung-Chun Lee, Yuan Lin Hsien (TW)

(73) Assignee: AU Optronics Corp., Hsinchu (TW)

( * ) Notice: Subject to any disclaimer, the term of this patent is extended or adjusted under 35 U.S.C. 154(b) by 1167 days.

(21) Appl. No.: 11/445,219

(22) Filed: Jun. 2, 2006

(65) Prior Publication Data
US 2006/0284533 A1    Dec. 21, 2006

(30) Foreign Application Priority Data
Jun. 21, 2005    (TW) .............................. 94120665 A

(51) Int. Cl.
H01L 51/50    (2006.01)

(52) U.S. Cl. ................... 257/98; 257/89; 257/E51.001; 313/504; 313/506; 428/690; 428/917

(58) Field of Classification Search .................. 313/504, 313/506; 428/690, 917; 257/89, 98, E51.001
See application file for complete search history.

(56) References Cited

U.S. PATENT DOCUMENTS

| | | | |
|---|---|---|---|
| 6,137,221 A | 10/2000 | Roitman et al. | |
| 6,140,764 A | 10/2000 | Xu et al. | |
| 6,576,352 B2 | 6/2003 | Hirai | |
| 6,806,642 B2 | 10/2004 | Pires et al. | |
| 2002/0063517 A1 | 5/2002 | Hosokawa | |
| 2004/0004433 A1* | 1/2004 | Lamansky et al. | 313/506 |
| 2005/0191776 A1* | 9/2005 | Lamansky et al. | 438/22 |

FOREIGN PATENT DOCUMENTS

WO    WO-02/11209 A2    2/2002

* cited by examiner

Primary Examiner—David Wu
Assistant Examiner—Vu A Nguyen
(74) Attorney, Agent, or Firm—Birch, Stewart, Kolasch & Birch, LLP

(57) ABSTRACT

An organic electroluminescent device comprises a first electrode, an organic color conversion layer, a carrier transport layer, an emissive layer, and a second electrode. The organic color conversion layer is disposed over the first electrode. The carrier transport layer is disposed over the organic color conversion layer. The emissive layer is disposed over the carrier transport layer. The second electrode is disposed over the emissive layer.

42 Claims, 8 Drawing Sheets

ORGANIC ELECTROLUMINESCENT DEVICE

This application claims the benefit of Taiwan Application Serial No. 094120665, filed Jun. 21, 2005, the subject matter of which is incorporated herein by reference.

BACKGROUND OF THE INVENTION (1) Field of the Invention

The present invention relates to an organic electroluminescent device, and more particularly, to an organic electroluminescent device having a color conversion layer.

(2) Description of the Prior Art

In present, the full-color technology used in an organic is electroluminescent display is classified into three types: (1) red, green, and blue light sources placed side-by-side pattern, (2) white light source through each of red, green, and blue color filters, and (3) color change media (CCM) replacing the color filters to convert blue light into other color lights. A brief introduction follows.

FIG. 1A shows an organic electroluminescent display 10a fabricated by placing red, green, and blue sub-pixels side-by-side pattern. As shown, blue, green, and red emissive layers 11, 12, 13 are evaporated on the substrate 14, i.e. heating the red, green, or blue emissive material in vacuum, and respectively depositing them in a predetermined position on the substrate 14 via photomask. An advantage is that these emissive materials are able to appear their color fully and acquire maximum performance. But a disadvantage is, after a long term use, a color shift occurs due to the difference in life between the emissive layers 11, 12, 13. In addition, reduction in pixel size may result in harder mask-making so as to reduce the process yield.

Referring to FIG. 1B, based on the way of white light source through color filters, an organic electroluminescent display 10b uses a white organic electroluminescent device (OELD) 15 as the light source and has a color filter 16 adhered on the light-exit surface of the white OELD 15. The red, green, or blue lights are generated when the white light goes through the color filter 16. Thus, each organic layer of the white OELD 15 can be formed entirely on the substrate 14, an advantage is that, it is unnecessary to align emissive layers with mask. Pixels of the organic electroluminescent display 10b are defined by a plurality of thin film transistors (not shown) and the color filters 16. Thereby, a rise in process yield or in resolution is made possible. However, it is difficult to produce the white OELD 15 that can emit "pure" white light.

Referring to FIG. 2A and FIG. 2B, the white OELD is usually binary or ternary structure. A white OELD 15a of FIG. 2A has two emissive layers such as a blue emissive layer 151 and a yellow emissive layer 152. A white OELD 15b of FIG. 2B has three emissive layers, such as a red emissive layer 153, a green emissive layer 154, and a blue emissive layer 155. When a hole combines with an electron to generate an exciton in different emissive layers, the different color lights are generated and mixed to produce white light. A disadvantage is, the distribution of the excitons is easy to change with the electrical field, so the color shift is made possible.

FIG. 1C shows that an organic electroluminescent display 10c fabricated by CCM replacing the color filters to absorb blue light. As shown, a blue OELD 17 with high light intensity is produced as a backlight having a blue emissive layer 171. The green and red lights are generated from the material 18 which can absorb blue light and then convert it efficiently. An advantage is that the process yield increase because the blue OELD is easier to produce than the white OELD. The reason is that the blue OELD has only one peak wavelength, but the white OELD has a plurality of peak wavelengths. However, the disadvantage is the emergent light of each pixel of the organic electroluminescent display 10c may scatter to mix with different color light of other pixel, so as to cause a color shift. A solution is to provide an external color filter (not shown) that may keep the color purity. In this way, the light need to be filtered twice, so the luminance and the efficiency reduce significantly. As usually, the CCM is hard to develop due to the requirement of high color purity and high efficiency, so the full-color OELD technology according to the CCM is rarely used in the industrial circle.

FIG. 3 is a spectrum of a blue OELD, each of whose layers is described as follows: anode (ITO)/hole injecting layer (CuPc)/hole transporting layer (NPB)/blue emissive layer/electron transporting layer (Alq)/electron injecting layer (LiF)/cathode (Al). The abscissa of the spectrum is light wavelength; the ordinate is light intensity. As shown, the blue OELD has about 456 nm of the major wavelength in emergent light. Without adding the CCM, the intensity of red and green lights are weak.

The present invention teaches a novel full-color display technology to overcome the shortages of forgoing three conventional organic electroluminescent display. The new technology employs less photomasks for simpler fabricating process, and implements electroluminescence to generate only one wavelength of the light. And also, the color shift and the color impurity are improved.

SUMMARY OF THE INVENTION

The object of the present invention is to provide a white organic electroluminescent device (OELD) which generates the white light via only one emissive layer and has an organic color conversion layer capable of acting as a carrier injecting layer due to photoluminescent property.

In one aspect of the present invention, an organic to electroluminescent device is provided to at least comprise a first electrode, an organic color conversion layer, a carrier transporting layer, an emissive layer, and a second electrode. The organic color conversion layer is disposed on the first electrode. The carrier transporting layer is disposed on the organic color conversion layer. The emissive layer is disposed on the carrier transporting layer. The second electrode is disposed on the emissive layer. The organic color conversion layer has the superior carrier transporting ability and high quantum efficiency. Besides color conversion, the organic color conversion layer can provide these carriers with injecting. The carrier transporting layer is disposed between the organic color conversion layer and the emissive layer. Thus, the carriers from the second electrode do not go into the organic color conversion layer by way of the emissive layer.

Due to the only one emissive layer, the manufacturing process in the white OELD of the present invention is easier than the conventional white OELD. In addition, the red, green, and blue light is defined as the color filters, not generated from the color conversion. Therefore, in the stage of fabricating OELD, it is unnecessary to add an isolating structure, like ITO, SiNx, SiOx etc., between these color conversion layers for preventing the color shift due to color light mixing.

BRIEF DESCRIPTION OF THE DRAWINGS

The present invention will now be specified with reference to its preferred embodiment illustrated in the drawings, in which.

DESCRIPTION OF THE PREFERRED EMBODIMENTS

Figure 4:
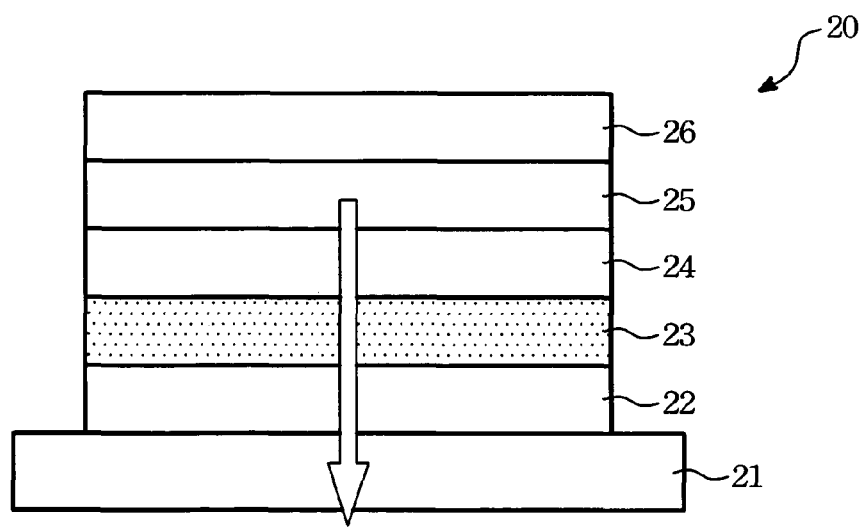
FIG. 4 is an organic electroluminescent device of the present invention.

Referring to FIG. 4, an organic electroluminescent device (OELD) 20, at least comprises a first electrode 22, an organic color conversion layer 23, a carrier transporting layer 24, an emissive layer 25, and a second electrode 26. The organic color conversion layer 23 is disposed on the first electrode 22. The carrier transporting layer 24 is disposed on the organic color conversion layer 23. The emissive layer 25 is disposed on the carrier transporting layer 24. The second electrode 26 is disposed on the emissive layer 25. The organic color conversion layer 23 has the superior carrier transporting ability and high quantum efficiency. Besides the function of color conversion, the organic color conversion layer 23 also serves as a carrier injection layer. The organic color conversion layer 23 allows only one kind of carrier, the electrons or the holes, to pass through itself for emitting light. Therefore, the carrier transporting layer 24 is interposed between the organic color conversion layer 23 and the emissive layer 25, for preventing the different kind of carriers from directly injecting into the organic color conversion layer 23 through the emissive layer 25.

Figure 5A:
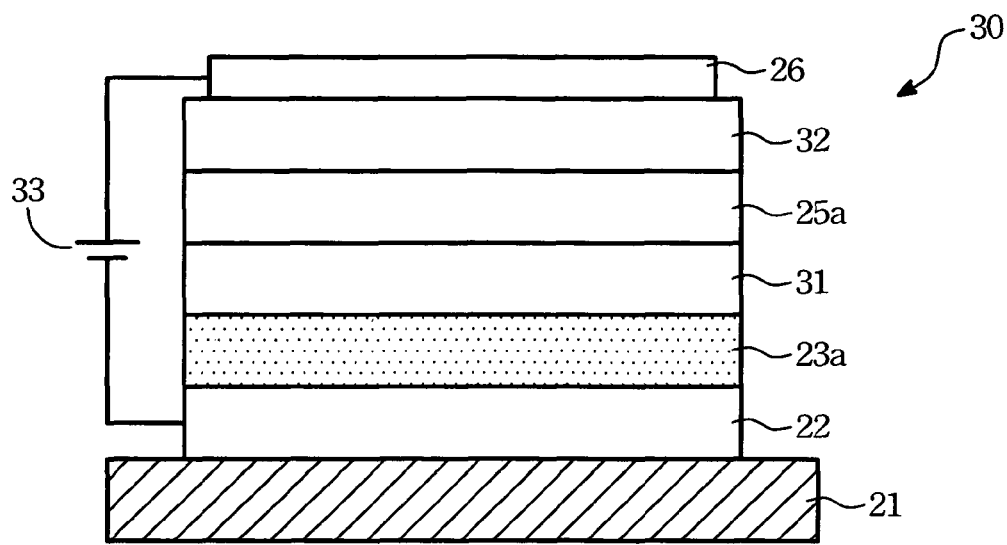
FIGS. 5A-5B show a bottom emission OELD of the present invention.

FIG. 5A takes a bottom emission OELD 30 as an example, and the above-mentioned carrier transporting layer acts as an electron transporting layer 31 in this example. A transparent conductive material is formed as the first electrode 22 on the substrate 21. The organic color conversion layer 23a absorbs the blue light to convert into the yellow light and acts as an electron injecting layer at the same time due to its superior electron transporting ability. The electron transporting layer 31 is disposed on the organic color conversion layer 23a. The blue emissive layer 25a and the second electrode 26 are sequentially disposed on the electron transporting layer 31. In this embodiment of the present invention, the first electrode 22 is electrically connected to the negative pole of power supply 33, and the second electrode 26 made of reflective material is electrically connected to the positive pole of the power supply 33. Thus, the emergent light of the blue emissive layer 25a can emit forward the organic color conversion layer 23a. Thus, a part of the blue light is converted into yellow light, and both blue and yellow are mixed to form white light. Preferably, a hole transporting layer 32 is disposed between the blue emissive layer 25a and the second electrode 26.

Figure 5B:
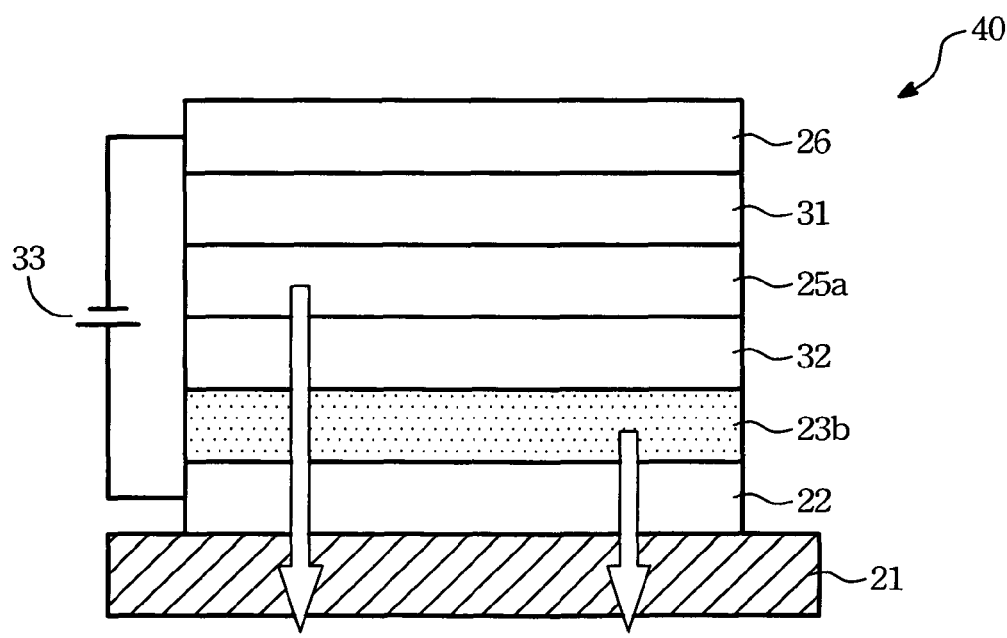

FIG. 5B takes another bottom emission OELD 40 as an example, and the above-mentioned carrier transporting layer acts as an hole transporting layer 32 in this example. A transparent conductive material as the first electrode 22 and is formed on the substrate 21. The organic color conversion layer 23b absorbs the blue light to convert into the yellow light and acts as an hole injecting layer at the same tine due to its superior hole transporting ability. The hole transporting layer 32 is disposed on the organic color conversion layer 23b. The blue emissive layer 25a and the second electrode 26 are sequentially disposed on the hole transporting layer 32. In this embodiment, the first electrode 22 is electrically connected to the positive pole of power supply 33, and the second electrode 26 is substantially made of a reflective material is electrically connected to the negative pole of the power supply 33. Preferably, a electron transporting layer 31 is disposed between the emissive layer 25a and the second electrode 26.

To sum up, a dual emission white OELD is formed when the second electrode 26 is substantially made of the transparent material, and another organic color conversion layer (not shown) can be disposed between the hole transporting layer 32 and the second electrode 26. For example, in FIG. 5A, a material with superior hole transporting ability can be applied to form another organic color conversion layer for manufacturing the dual emission white OELD. In FIG. 5B, a material with superior electron transporting ability can be applied to form another organic color conversion layer between the electron transporting layer 31 and the second electrode 26 for manufacturing the dual emission white OELD. Consider the attenuation of luminance, the preferable thickness of the organic color conversion layer is ranged from about 30 nm to about 1000 nm. The preferable thickness of the carrier transporting layer is ranged from about 50 Å to about 5000 Å. The preferable thickness of the emissive layer 25 is ranged from about 50 Å to about 2000 Å. The present invention emphasizes the correlation between the organic color conversion layer and the emissive layer. Therefore, there is no restriction on the light color which appears before or after color conversion.

Figure 6:
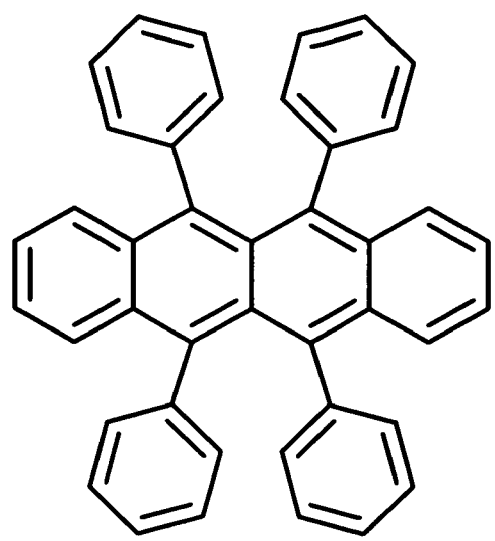
FIG. 6 is a structure of rubrene.

In aspect of material, the organic color conversion layer 23 is made of rubrene or its derivative. The chemical structure of rubrene is shown as FIG. 6. The hole transporting layer 32 is substantially made of diamine or its derivative, such as N,N'-bis(1-naphthyl)-N,N'-diphenyl-1,1'-biphenyl-4,4'-diamine (NPB), N,N'-diphenyl-N,N'-(3-methylphenyl)-1,1-biphenyl-4,4'-diamine (TPD), 4,4',4"-tris(3-methylphenylphenylamino(2T-NATA), or their derivatives. The electron transporting layer 31 is substantially made of tris(8-hydroxyquinolato) aluminum (Alq), N-arylbenzimidazoles (TPBI), or derivative of anthracene, fluorene and spirofluorene. The first electrode 22 or the second electrode 26 is made of ITO, IZO, AZO, ZnO, InN, SnO2, or their mixture. The first electrode 22 or the second electrode 26 is made of a metallic material such as Al, Ca, Ag, Ni, Cr, Ti, Mg:Ag alloy, Mg, their alloy, or mixing layers.

Figure 7:
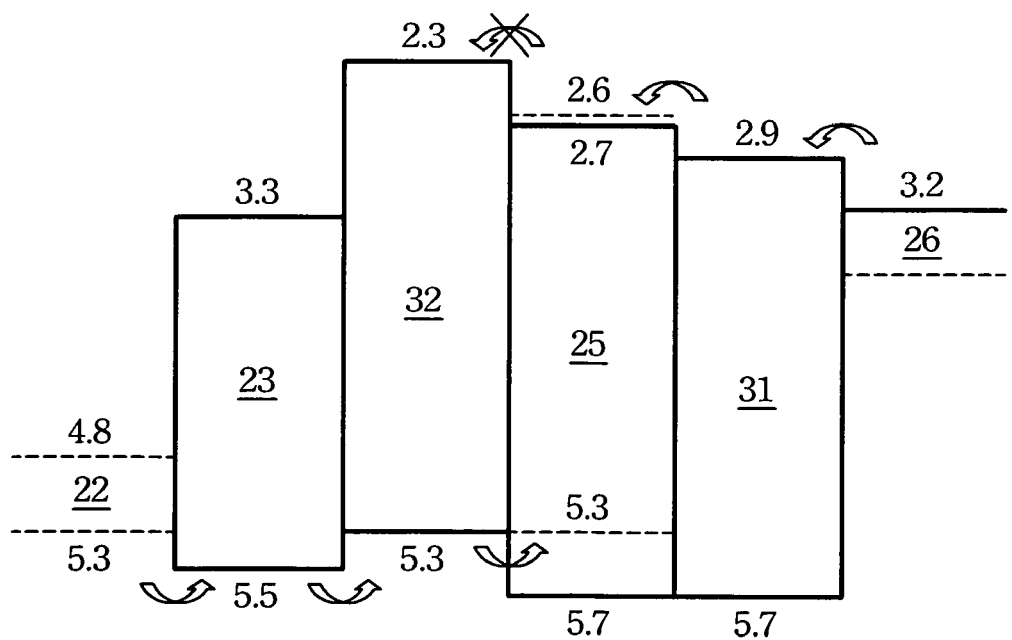
FIG. 7 is a energy diagram showing energy gap between layers of the OELD according to the present invention.

In respect of OELD, the work function of anode should substantially match the highest occupied molecular orbit (HOMO) of the hole injecting layer, likewise, the work function of cathode should substantially match the lowest unoccupied molecular orbit (LUMO) of the electron injecting layer. FIG. 7 takes the OELD 40 of FIG. 5B as an example.

The material of each layer of the OELD 40 is described as follows: anode 22 (ITO)/organic color conversion layer 23 (rubrene)/hole transporting layer 32 (NPB)/blue emissive layer 25/electron transporting layer 31 (Alq)/cathode (LiF/Al). The work function of the anode 22 is about 4.8 eV to about 5.3 eV. The HOMO of the organic color conversion layer 23 is about 5.5 eV. That is a good match for holes to move into the hole transporting layer 32. When the electrons from the cathode 26 flow into the blue emissive layer 25, they are obstructed by the hole transporting layer 32 not to directly enter the organic color conversion layer 23 and the electrons can not effect the organic color conversion layer 23. It illustrates that the active mechanism of the organic color conversion layer 23 can not be an electroluminescence, but can be a photoluminescence.

Figure 1A:
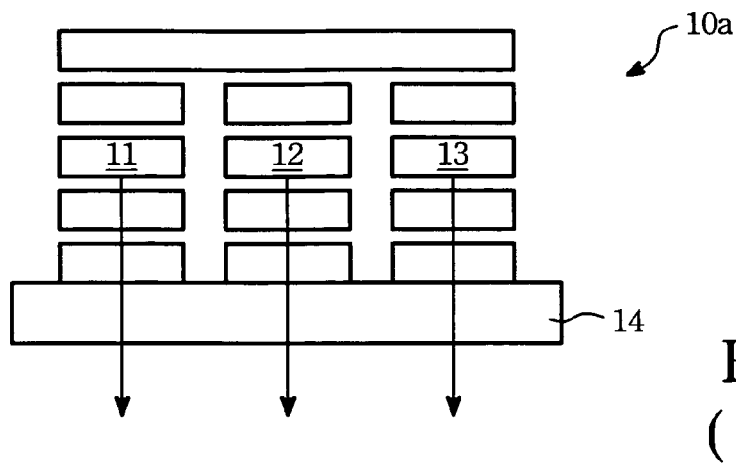
FIG. 1A is a conventional organic electroluminescent display with a RGB side-by-side pattern.
Figure 1B:
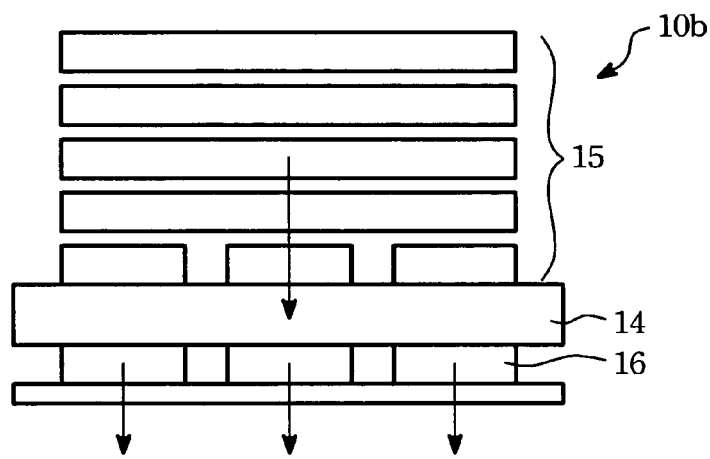
FIG. 1B is a conventional organic electroluminescent display with white light source plus color filter.
Figure 1C:
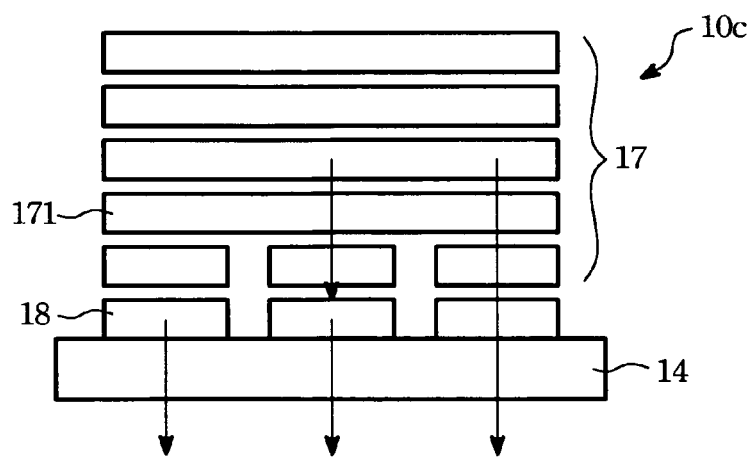
FIG. 1C is a conventional organic electroluminescent display with blue light source plus color change media.
Figure 2A:
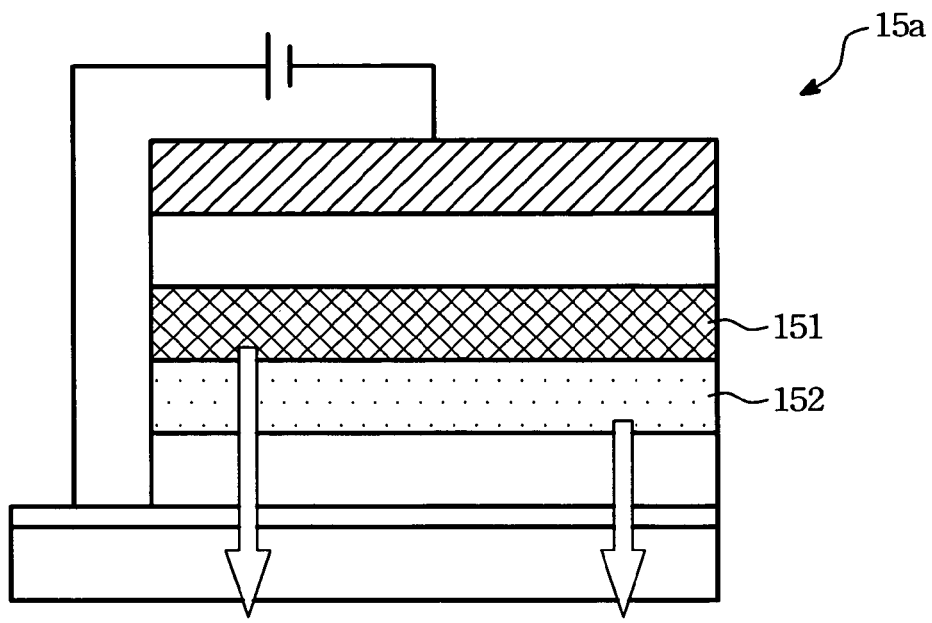
FIG. 2A is a binary white organic electroluminescent device (OELD)
Figure 2B:
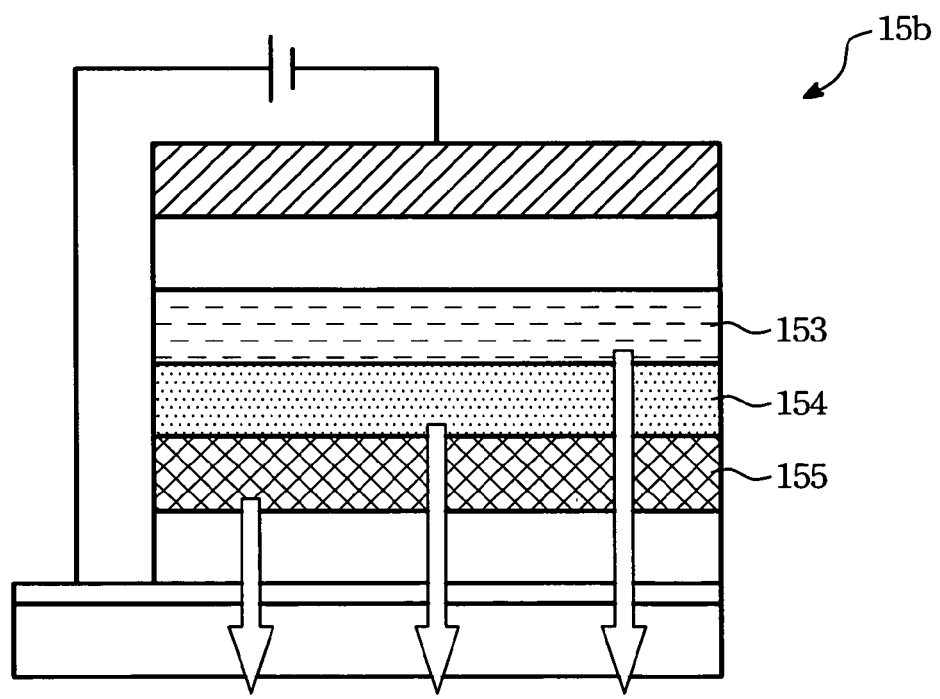
FIG. 2B is a ternary white OELD.
Figure 3:
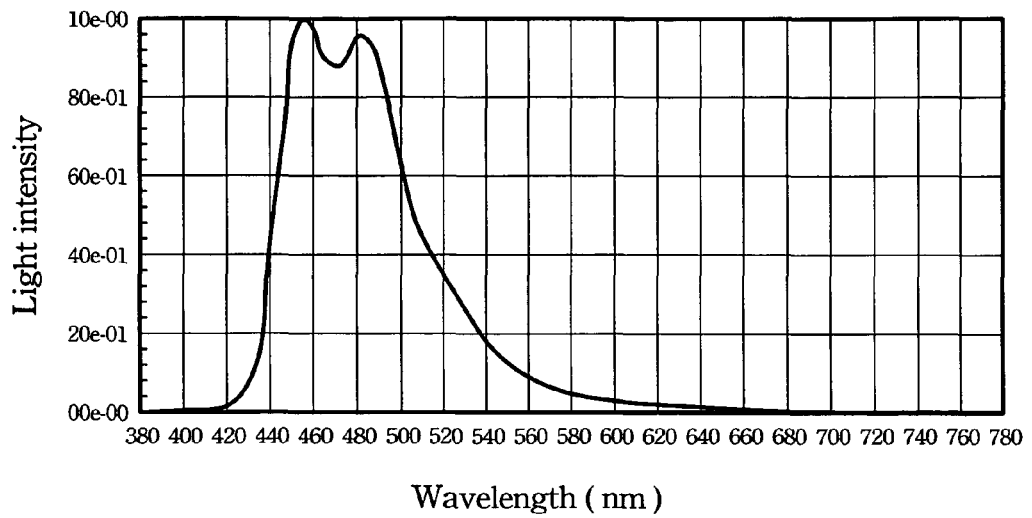
FIG. 3 is a spectrum of a blue OELD.
Figure 8A:
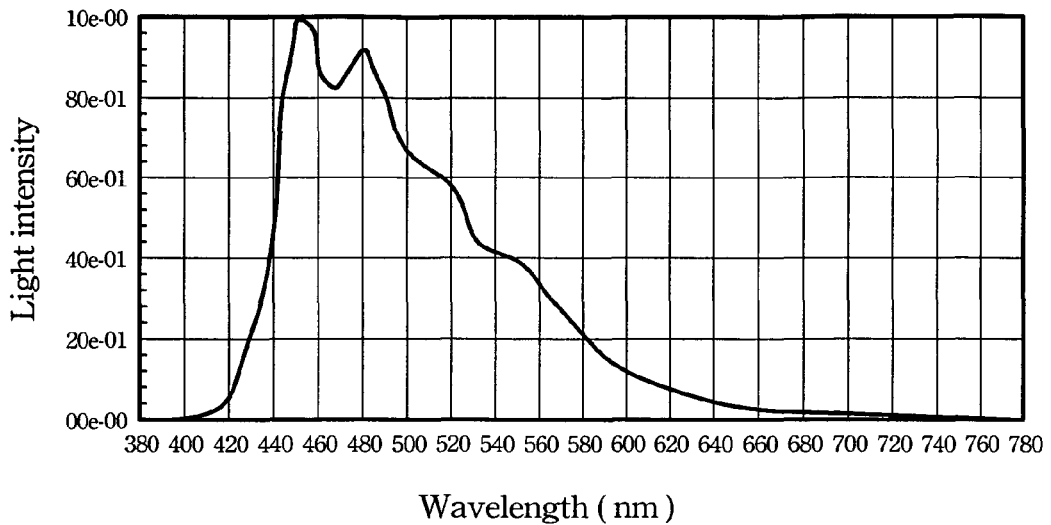
FIG. 8A is a spectrum of the OELD with an organic color conversion layer which is made of rubrene that has a first thickness.

Continued from the preceding paragraph, the fabricating process of the OELD is described in detail. First, the ITO layer is treated with UV/Ozone. Next the rubrene layer is evaporated on the ITO layer. Substantially, the NPB layer, the blue emissive layer 25, and Alq layer are sequentially evaporated on the ITO layer. At last, LiF and Al are evaporated on the Alq layer, and then a packaging is implemented. FIG. 8A is a spectrum of the OELD including the organic color conversion layer made of about 60 nm thick rubrene. The abscissa is light wavelength (nm), the ordinate is light intensity. The visible light wavelength of color light is ranged as follows: red (about 780 nm to about 630 nm); orange (about 630 nm to about 600 nm); yellow (about 600 nm to about 570 nm); green (about 570 nm to about 500 nm); blue (about 500 nm to about 470 nm); indigo (about 470 nm to about 420 nm); violet (about 420 nm to about 380 nm). Compare with FIG. 3, the light intensity increases in the wavelength range of the yellow light after color conversion.

Figure 8B:
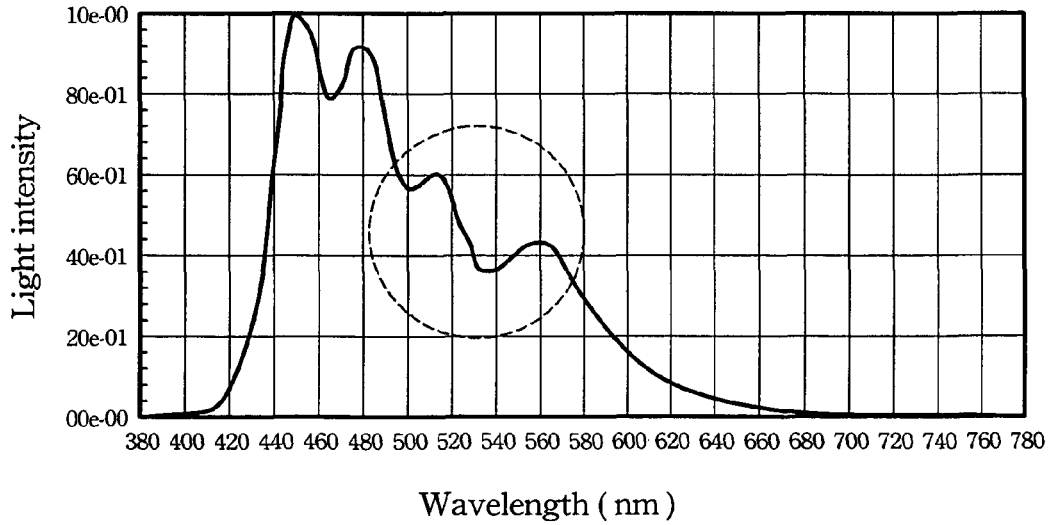
FIG. 8B is a spectrum of the OELD with an organic color conversion layer which is made of rubrene that has a second thickness.

Referring to FIG. 8B, a rubrene with about 150 nm of thickness is evaporated as the organic color conversion layer by the same method illustrated in FIG. 8A. It is obvious that the peak of green-cyan light or yellow light is higher than FIG. 8A, however, the peak of blue light does not reduce. It illustrates that using rubrene to form the organic color conversion layer with a thickness about 60 nm to 150 nm can achieve good performance.

Figure 9A:
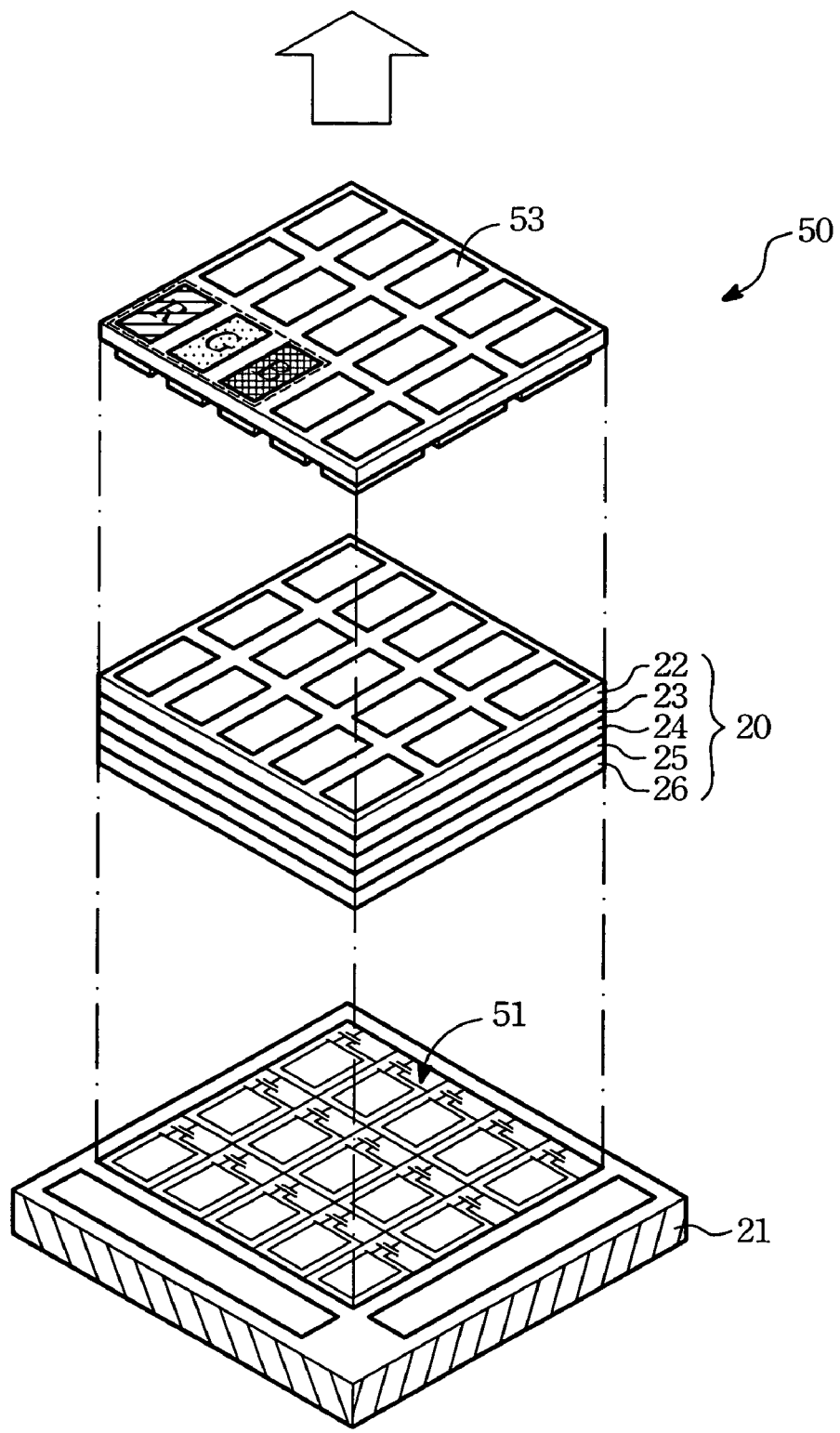
FIG. 9A is a top emission type organic electroluminescent display.
Figure 9B:
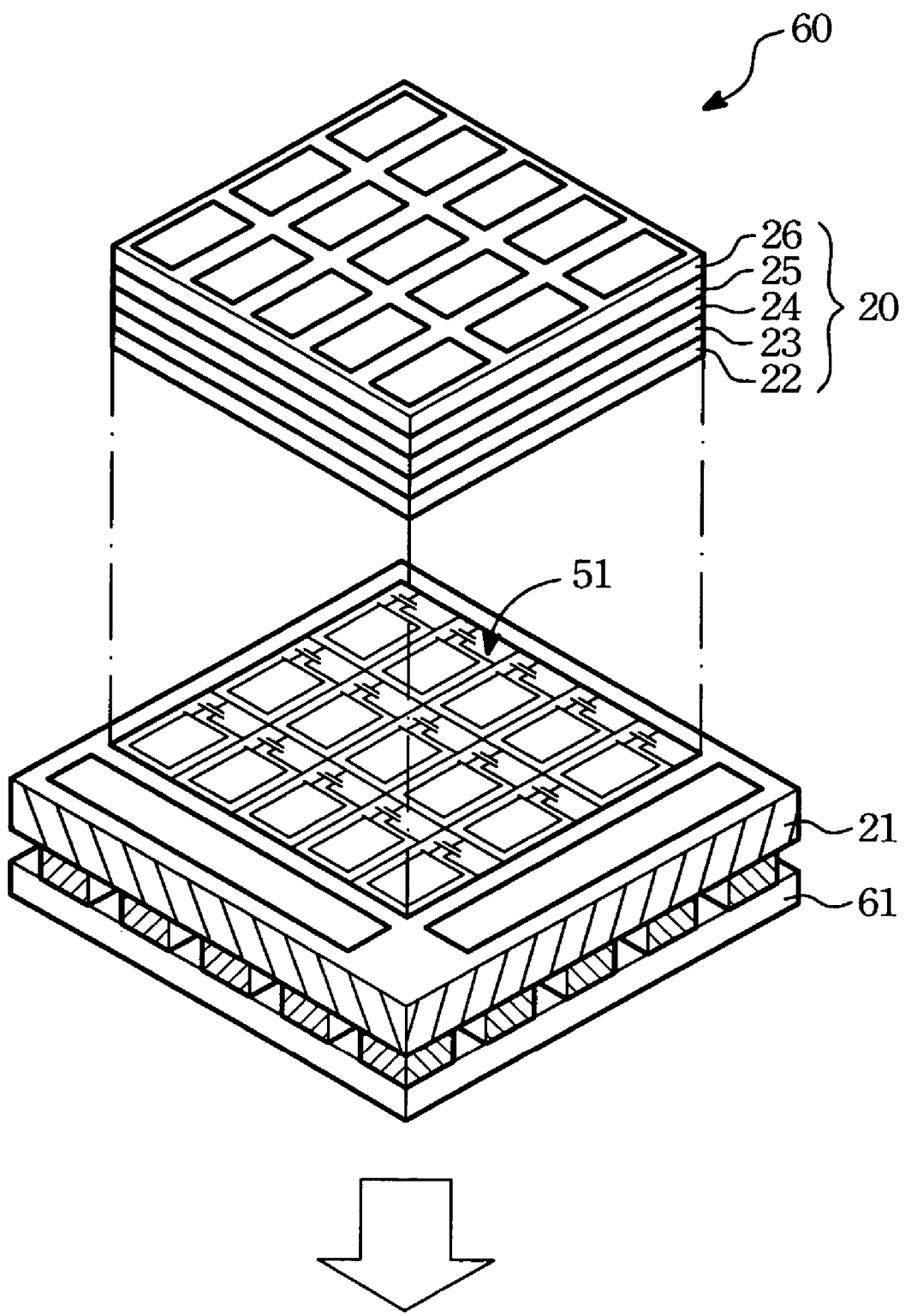
FIG. 9B is a bottom emission type organic electroluminescent display.

FIGS. 9A-9B shows two organic electroluminescent displays, both of which comprise a substrate 21 with a plurality of thin film transistors (TFTs) and an organic electroluminescent device (OELD) 20. The organic electroluminescent device 20 is disposed on the substrate 21 and is electrically connected to each thin film transistor. The first electrode 22 is substantially made of the transparent material. The emissive layer 25 is disposed between the first electrode 22 and the second electrode 26. The carrier transporting layer 24 is disposed between the first electrode 22 and the emissive layer 25. The organic color conversion layer 23 is disposed between the first electrode 22 and the carrier transporting layer 24.

Referring to FIG. 9A, an array of thin film transistors (TFTs) 51 is disposed on the substrate 21. The organic electroluminescent device 20 is fabricated on the array of TFTs 51. The color filter 53 covers on the organic electroluminescent device 20. If the second electrode 26 is substantially made of the reflective material and disposed on the substrate 21, a top emission type organic electroluminescent display 50 is formed. When the first electrode 22 acts as the anode, the carrier transporting layer 24 acts as the hole transporting layer. When the first electrode 22 acts as the cathode, the carrier transporting layer 24 acts as the electron transporting layer. The hole transporting layer is made of diamine or its derivative. The electron transporting layer is substantially made of tris(8-hydroxyquinolato) aluminum (Alq), N-aryl-benzimidazoles (TPBI), or derivative of anthracene, fluorene and spirofluorene. The color filter 53 is adhered on the organic electroluminescent device 20 to define the position of the RGB sub-pixels.

Referring to FIG. 9B, an array of TFTs 51 is disposed on the substrate 21. The organic electroluminescent device 20 is disposed on the substrate and being electrically connected to the array of TFTs 51. The color filter 61 is adhered under the substrate 21. In this embodiment, the relative position of the substrate 21 and each layer of the organic electroluminescent device 20 is different from FIG. 9A. The first electrode 22 is disposed on the substrate 21. The second electrode 26 is substantially made of the reflective material. The result structure is a bottom emission type organic electroluminescent display 60. As above, the carrier transparent layer 24 is possible to act as the hole or electron transporting layers which is determined by the first electrode 22 acting as the anode or the cathode. The color filter 61 is adhered below the substrate 21 to define the position of the RGB sub-pixels.

In conclusion, the color filters shown in both FIGS. 9A and 9B are adhered at the side of the first electrode 22 (transparent electrode). Their organic color conversion layers 23 are disposed between the first electrode 22 and the carrier transporting layer 24. The preferable thickness of the organic color conversion layer 23 is ranged from about 30 to about 1000 nm. In addition, a second carrier transporting layer is selectively interposed between the emissive layer 25 and the second electrode 26. The selection about the material of the hole or electron transporting layer is determined by the second electrode acting as the anode or the cathode.

Combine FIG. 9A and FIG. 9B, a dual emission organic electroluminescent display is made possible based on an organic electroluminescent device with two transparent electrodes. The organic color conversion layers are formed between the two transparent electrodes, and the color filters are adhered outside the two transparent electrodes.

The advantages of the present invention are described as follows.

A. White light is not generated by multiple emissive layers, so the color shift is avoided due to well-distribution of excitons.

B. The color conversion layer can act as the carrier injecting layer.

C. It is easy to produce than the conventional OELD due to only one kind of emissive layer.

D. The red, green, and blue light are determined by the color filter, not generated from color conversion. It is unnecessary to form a plurality of color conversion layers and their isolating structure, the color shift generated from the mixing of light of different colors can not occur.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. An organic electroluminescent device, comprising:
a first electrode;
an organic color conversion layer disposed on the first electrode;
a carrier transporting layer disposed on the organic color conversion layer, wherein the carrier transporting layer includes an electron transporting layer;

an emissive layer disposed on the carrier transporting layer; and a second electrode disposed on the emissive layer.

2. The device of claim 1, further comprising a hole transporting layer disposed between the emissive layer and the second electrode.

3. The device of claim 1, wherein at least one of the first electrode and the second electrode is substantially made of a transparent material.

4. The device of claim 1, wherein the thickness of the organic color conversion layer ranges from about 30 nm to about 1000 nm.

5. The device of claim 1, wherein the organic color conversion layer is made of rubrene or a derivative thereof.

6. The device of claim 1, wherein the thickness of the carrier transporting layer ranges from about 50 Å to about 5000 Å.

7. The device of claim 1, wherein the thickness of the emissive layer ranges from about 50 Å to about 2000 Å.

8. The device of claim 1, wherein the carrier transporting layer is made of a material selected from the group consisting of tris(8-hydroxyquinolato) aluminum (Alq), N-arylbenzimidazoles (TPBI), derivatives of anthracene, and derivatives of fluorene and spirofluorene.

9. An organic electroluminescent display, comprising:
a substrate with a plurality of thin film transistors; and
an organic electroluminescent device (OELD) disposed on the substrate, the organic electroluminescent device being electrically connected to each thin film transistor, the OELD comprising:
a first electrode;
an emissive layer disposed on the first electrode;
wherein the carrier transporting layer includes an electron transporting layer;
an organic color conversion layer disposed between the first electrode and the carrier transporting layer; and
a second electrode disposed on the emissive layer.

10. The display of claim 9, further comprising a color filter adhered to the outer side of the first electrode of the organic electroluminescent device.

11. The display of claim 9, wherein at least one of the first electrode and the second electrode is substantially made of a transparent material.

12. The organic electroluminescent display of claim 9, wherein the carrier transporting layer comprises a electron transporting layer and is made of tris(8-hydroxyquinolato) aluminum (Alq), N-arylbenzimidazoles (TPBI), derivative of anthracene, or derivatives of fluorene and of spirofluorene.

13. The display of claim 9, wherein the thickness of the organic color conversion layer ranges from about 30 nm to about 1000 nm.

14. The display of claim 9, wherein the organic color conversion layer is made of rubrene or derivative thereof.

15. The display of claim 9, further comprising a second carrier transporting layer disposed between the emissive layer and the second electrode.

16. An organic electroluminescent device, comprising:
a first electrode;
an organic color conversion layer disposed on the first electrode;
a first carrier transporting layer disposed on the organic color conversion layer;
an emissive layer disposed on the carrier transporting layer;
a second electrode disposed on the emissive layer; and
a second carrier transporting layer disposed between the emissive layer and the second electrode,
wherein the organic color conversion layer is made of rubrene or a derivative thereof.

17. The device of claim 16, further comprising an electron transporting layer disposed between the emissive layer and the second electrode.

18. The device of claim 16, wherein at least one of the first electrode and the second electrode is substantially made of a transparent material.

19. The device of claim 16, wherein the thickness of the organic color conversion layer ranges from about 30 nm to about 1000 nm.

20. The device of claim 16, wherein the first carrier transporting layer is made of diamine or a derivative thereof.

21. The device of claim 20, wherein the derivative of the diamine is selected from the group consisting of N,N'-bis(1-naphthyl)-N,N'-diphenyl-1,1'-biphenyl-4,4'-diamine (NPB), N,N'-diphenyl-N,N'-(3-methylphenyl)-1,1-biphenyl-4,4'-diamine (TPD), 4,4',4''-tris(3-methylphenylphenylamino (2T-NATA), and derivatives thereof.

22. The device of claim 16, wherein the thickness of the first carrier transporting layer ranges from about 50 Å to about 5000 Å.

23. The device of claim 16, wherein the thickness of the emissive layer ranges from about 50 Å to about 2000 Å.

24. The device of claim 16, wherein the first carrier transporting layer is made of a material selected from the group consisting of tris(8-hydroxyquinolato) aluminum (Alq), N-arylbenzimidazoles (TPBI), derivatives of anthracene, and derivatives of fluorene and spirofluorene.

25. An organic electroluminescent device, comprising:
a first electrode;
an organic color conversion layer disposed on the first electrode, wherein the organic color conversion layer is made of rubrene or a derivative thereof;
a carrier transporting layer disposed on the organic color conversion layer;
an emissive layer disposed on the carrier transporting layer; and
a second electrode disposed on the emissive layer.

26. The device of claim 25, wherein the carrier transporting layer comprises a hole transporting layer.

27. The device of claim 26, further comprising an electron transporting layer disposed between the emissive layer and the second electrode.

28. The device of claim 25, wherein at least one of the first electrode and the second electrode is substantially made of a transparent material.

29. The device of claim 25, wherein the thickness of the organic color conversion layer ranges from about 30 nm to about 1000 nm.

30. The device of claim 25, wherein the carrier transporting layer is a hole transporting layer which is made of diamine or a derivative thereof.

31. The device of claim 30, wherein the derivative of the diamine is selected from the group consisting of N,N'-bis(1-naphthyl)-N,N'-diphenyl-1,1'-biphenyl-4,4'-diamine (NPB), N,N'-diphenyl-N,N'-(3-methylphenyl)-1,1-biphenyl-4,4'-diamine (TPD), 4,4',4''-tris(3-methylphenylphenylamino (2T-NATA), and derivatives thereof.

32. The device of claim 25, wherein the thickness of the carrier transporting layer ranges from about 50 Å to about 5000 Å.

33. The device of claim 25, wherein the thickness of the emissive layer ranges from about 50 Å to about 2000 Å.

34. The device of claim 25, wherein the carrier transporting layer is made of a material selected from the group consisting of tris(8-hydroxyquinolato) aluminum (Alq), N-arylbenzimidazoles (TPBI), derivatives of anthracene, and derivatives of fluorene and spirofluorene.

35. An organic electroluminescent device, comprising:
a first electrode;
an organic color conversion layer disposed on the first electrode;
a carrier transporting layer disposed on the organic color conversion layer, wherein the carrier transporting layer is made of a material selected from the group consisting of tris(8-hydroxyquinolato) aluminum (Alq), N-arylbenzimidazoles (TPBI), derivatives of anthracene, and derivatives of fluorene and spirofluorene;
an emissive layer disposed on the carrier transporting layer; and
a second electrode disposed on the emissive layer.

36. The device of claim 35, further comprising a hole transporting layer disposed between the emissive layer and the second electrode.

37. The device of claim 35, wherein at least one of the first electrode and the second electrode is substantially made of a transparent material.

38. The device of claim 35, wherein the thickness of the organic color conversion layer ranges from about 30 nm to about 1000 nm.

39. The device of claim 35, wherein the organic color conversion layer is made of rubrene or a derivative thereof.

40. The device of claim 35, wherein the thickness of the carrier transporting layer ranges from about 50 Å to about 5000 Å.

41. The device of claim 35, wherein the thickness of the emissive layer ranges from about 50 Å to about 2000 Å.

42. An organic electroluminescent display, comprising:
a substrate with a plurality of thin film transistors; and
the organic electroluminescent device of claim 22 disposed on the substrate, wherein the organic electroluminescent device being electrically connected to each thin film transistor.

* * * * *